(12) United States Patent
Han et al.

(10) Patent No.: US 7,923,331 B2
(45) Date of Patent: Apr. 12, 2011

(54) METHOD OF FABRICATING RECESS CHANNEL TRANSISTOR HAVING LOCALLY THICK DIELECTRICS AND RELATED DEVICES

(75) Inventors: Sung-Hee Han, Hwaseong-si (KR); Jin-Woo Lee, Yongin-si (KR); Tae-Young Chung, Yongin-si (KR); Ja-Young Lee, Ansan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 119 days.

(21) Appl. No.: 12/232,020

(22) Filed: Sep. 10, 2008

(65) Prior Publication Data

US 2009/0127609 A1 May 21, 2009

(30) Foreign Application Priority Data

Sep. 10, 2007 (KR) ........................ 10-2007-0091733

(51) Int. Cl.
*H01L 21/336* (2006.01)
(52) U.S. Cl. ............ 438/270; 257/E29.201; 257/E29.26
(58) Field of Classification Search .......... 438/270–272; 257/E29.201, E29.26
See application file for complete search history.

(56) References Cited

U.S. PATENT DOCUMENTS

| 5,629,226 | A  | * | 5/1997  | Ohtsuki    | 438/389 |
| 6,476,444 | B1 | * | 11/2002 | Min        | 257/330 |
| 7,670,910 | B2 | * | 3/2010  | Kim et al. | 438/270 |
| 2006/0211229 | A1 | * | 9/2006 | Kim        | 438/589 |
| 2007/0148934 | A1 | * | 6/2007 | Cho et al. | 438/585 |

FOREIGN PATENT DOCUMENTS

| KR | 10-2007-0013726 | 1/2007 |
| KR | 10-2007-0047042 | 5/2007 |
| KR | 10-0718248      | 5/2007 |

OTHER PUBLICATIONS

English language Abstract KR 10-2007-0010835 dated Jan. 24, 2007.

* cited by examiner

*Primary Examiner* — Brook Kebede
(74) *Attorney, Agent, or Firm* — Harness, Dickey & Pierce, P.L.C.

(57) ABSTRACT

Provided are a method of fabricating a recess channel transistor and a related semiconductor device. The method may include forming a first gate trench on a substrate, forming a dielectric spacer on a sidewall of the first gate trench, forming a second gate trench on the substrate under the first gate trench, and forming a gate electrode to fill the trenches. The dielectric spacer may remain between the gate electrode and the substrate.

19 Claims, 6 Drawing Sheets

METHOD OF FABRICATING RECESS CHANNEL TRANSISTOR HAVING LOCALLY THICK DIELECTRICS AND RELATED DEVICES

PRIORITY STATEMENT

This application claims priority under 35 U.S.C. §119 to Korean Patent Application No. 10-2007-0091733, filed Sep. 10, 2007, in the Korean Intellectual Property Office (KIPO), the entire contents of which are incorporated herein by reference.

BACKGROUND

1. Field

Example embodiments relate to a semiconductor device and a method of fabricating the same, and more particularly, to a method of fabricating a recess channel transistor having locally thick dielectrics and a related device.

2. Description of the Related Art

As the integration density of semiconductor devices increases, the size of patterns that the semiconductor devices consist of is shrinking. The reduction in the size of the gate electrode causes the channel length to be reduced, and therefore, several problems, e.g., a short channel effect, can occur. In order to overcome these problems, recess channel transistors having relatively long effective channel lengths compared to the planar sizes of the gate electrodes have been studied, for example, a recess channel transistor in the related art.

SUMMARY

In example embodiments, a method of fabricating a recess channel transistor may include forming a first gate trench on a substrate; forming a dielectric spacer on a sidewall of the gate trench, forming a second gate trench on the substrate under the first gate trench, forming a gate dielectric on an inner wall of the gate trenches, and forming a gate electrode to fill the gate trenches. The dielectric spacer may remain between the gate electrode and the substrate.

According to example embodiments, a mask pattern may be formed on the substrate. A first preliminary gate trench may be formed by etching the substrate using the mask pattern as an etch mask. A first gate trench may be formed by expanding the first preliminary gate trench. The expansion of the first preliminary gate trench may be performed by an isotropic etch process.

According to example embodiments, a first dielectric layer may be formed on an inner wall of the first gate trench. A second dielectric layer may be formed on the first dielectric layer. The first and second dielectric layers may be etched to form the dielectric spacer until the substrate is exposed. The first dielectric layer may be formed by a radical oxidation method so as to have a length of between about 1 nm and about 10 nm. A material of the second dielectric layer may be different from a material of the first dielectric layer. The second dielectric layer may be formed with nitride.

According to example embodiments, the substrate may be etched using the dielectric spacer as an etch mask to form a second preliminary gate trench under the first gate trench. The second gate trench may be formed by expanding the second preliminary gate trench. The dielectric spacer may remain on a sidewall of the first gate trench. The expansion of the second preliminary gate trench may be performed by one selected from the group consisting of a heat treatment under an $H_2$ environment, an isotropic etch process and a combination thereof.

According to example embodiments, the gate dielectric may be formed to cover a sidewall of the second gate trench. In example embodiments, the dielectric spacer may contact the gate electrode. A thickness of the gate dielectric layer may be thinner than a thickness of the dielectric spacer.

According to example embodiments, the gate dielectric may be formed to cover a sidewall of the second gate trench and the dielectric spacer. In example embodiments, a semiconductor device may include a substrate having a first gate trench and a second gate trench, the second gate trench being formed under the first gate trench; a dielectric spacer covering a sidewall of the first gate trench; and a gate electrode filling the gate trenches. The dielectric spacer may remain between the gate electrode and the substrate.

According to example embodiments, the dielectric spacer may have a first dielectric pattern and a second dielectric pattern. The first dielectric pattern may cover a sidewall of the gate trench. The second dielectric pattern may be formed on the first dielectric pattern. The first dielectric pattern may be formed with silicon oxide by a radical oxidation method and may have a thickness of between about 1 nm and about 10 nm. A material of the second dielectric pattern may be different from a material of the first dielectric pattern. According to example embodiments, a width of the second gate trench may be larger than a width of the first gate trench.

According to example embodiments, a gate dielectric may be formed between the gate electrode and the substrate. In example embodiments, the dielectric spacer may contact the gate electrode. The gate dielectric may be thinner than the dielectric spacer. According to example embodiments, the gate dielectric may be formed to cover a sidewall of the second gate trench and the dielectric spacer.

According to example embodiments, the gate electrode may protrude upwardly from the substrate. According to example embodiments, an interlayer dielectric film may be formed on the substrate having the gate electrode. A bit line may be formed in the interlayer dielectric film. A bit plug may be formed between the bit line and the substrate. A storage node may be formed on the interlayer dielectric film. A buried contact plug may be formed between the storage node and the substrate.

BRIEF DESCRIPTION OF THE DRAWINGS

Example embodiments will be more clearly understood from the following detailed description taken in conjunction with the accompanying drawings.

FIGS. 1 to 11 are cross-sectional views illustrating a method of fabricating a semiconductor device according to example embodiments.

Figure 1:
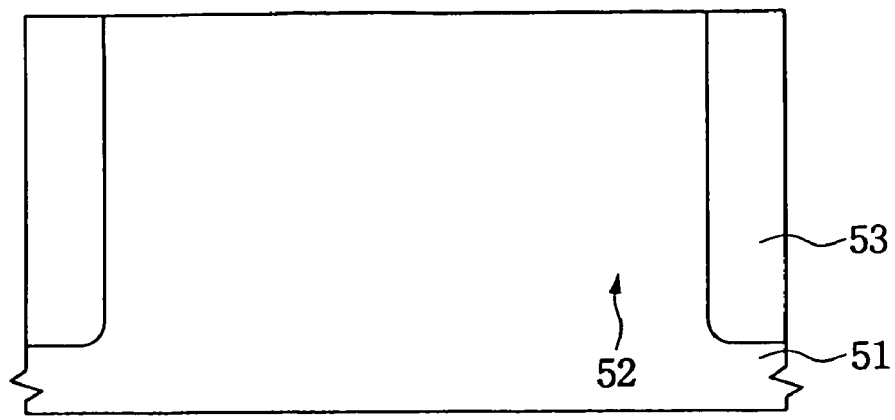
FIGS. 1-11 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will be described more fully hereinafter with reference to the accompanying drawings, in which example embodiments are shown. Example embodiments may, however, be embodied in different forms and should not be construed as limited to example embodiments set forth herein. Rather, example embodiments are provided so that this disclosure will be thorough and complete, and will fully convey the scope of example embodiments to those skilled in the art. In the drawings, the thickness of layers and regions are exaggerated for clarity. In addition, when a layer is described to be formed on another layer or on a substrate, this means that the layer may be formed on the other layer or on the substrate, or a third layer may be interposed between the layer and the other layer or the substrate. Like numbers refer to like elements throughout the specification.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, some example embodiments will be explained in detail with reference to the accompanying drawings.

FIGS. 1 to 11 are cross-sectional views illustrating a method of fabricating a semiconductor device according to example embodiments. The semiconductor device suitable to example embodiments may be a DRAM device. Referring to FIG. 1, a device isolation film 53 may be formed on a substrate 51 to define an active region 52. The substrate 51 may be a silicon wafer, e.g., a bulk wafer or a silicon on insulator (SOI) wafer. A process of implanting impurity ions may be added in order to form well regions. However, the detailed description about the implanting process will be omitted.

Figure 2:
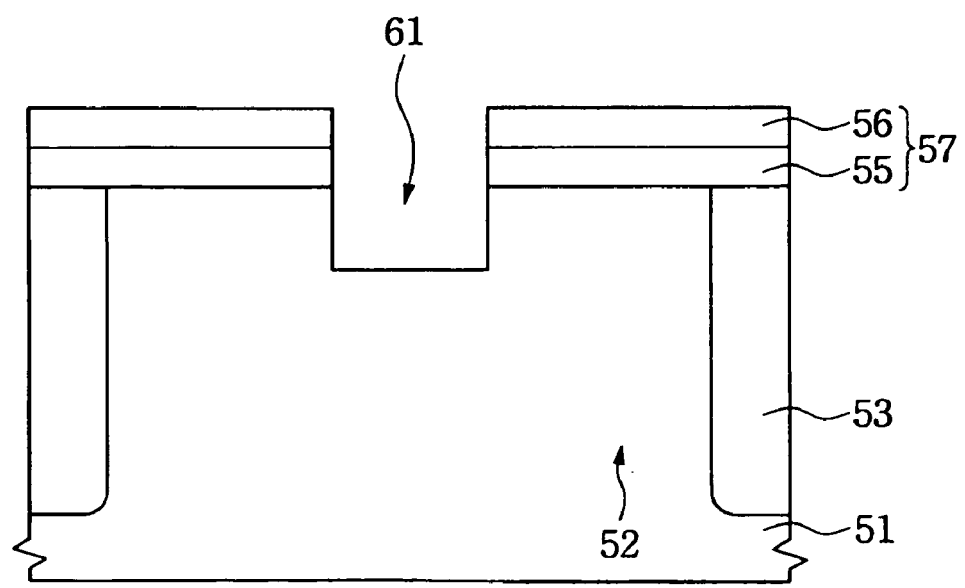

The device isolation film 53 may be formed by using a shallow trench isolation technique. The device isolation film 53 may be formed with an insulating material, e.g., silicon oxide, silicon nitride or combination thereof. A top surface of the active region 52 may be exposed. Referring to FIG. 2, a mask pattern 57 may be formed on the substrate 51 having the device isolation film 53. The active region 52 may be partially etched using the mask pattern 57 as an etch mask to form a first preliminary trench 61.

For example, the mask pattern 57 may be formed by sequentially stacking a medium temperature oxide film 55 and a silicon oxide film 56 and by using a photolithography process. Alternatively, the mask pattern 57 may be formed with a silicon oxide layer, a silicon nitride layer, a silicon oxynitride layer, a photoresist layer, and/or a combination thereof. The active region 52 may be isotropically etched to form the first preliminary trench 61. While the first preliminary trench 61 is formed, the mask pattern 57 may also be etched so that a thickness of the mask pattern 57 may be reduced.

A shape of the first preliminary trench 61 may be a reversed trapezoidal shape in which a width of an upper portion is wider than a width of a lower portion or a trapezoidal shape in which a width of a lower portion is wider than a width of an upper portion. However, it is assumed that an upper width of the first preliminary trench 61 is substantially equal to a lower width of the first preliminary trench 61. The active region 52 may be exposed on a sidewall and a bottom surface of the first preliminary trench 61. The first preliminary trench 61 may be formed on a higher level than a bottom surface of the device isolation film 53.

Figure 3:
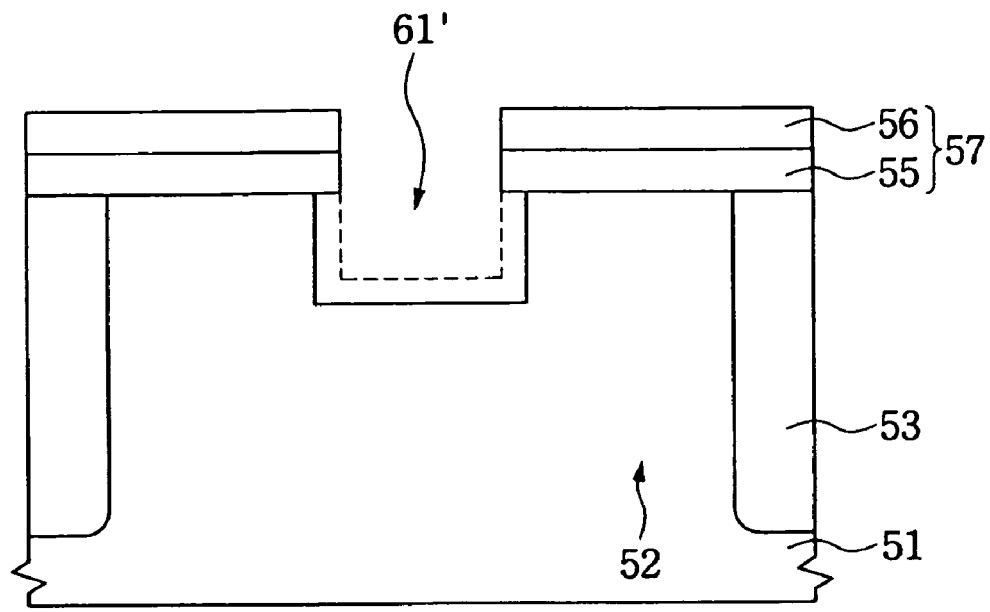

Referring to FIG. 3, the exposed active region 52 may be etched to expand the first preliminary trench 61. The expansion of the first preliminary trench 61 may be performed by using an anisotropic etch process that has a higher etch rate to the exposed active region 52. As a result, a first gate trench 61' may be formed on the active region 52. However, the process expanding the first preliminary trench 61 may be omitted.

Figure 4:
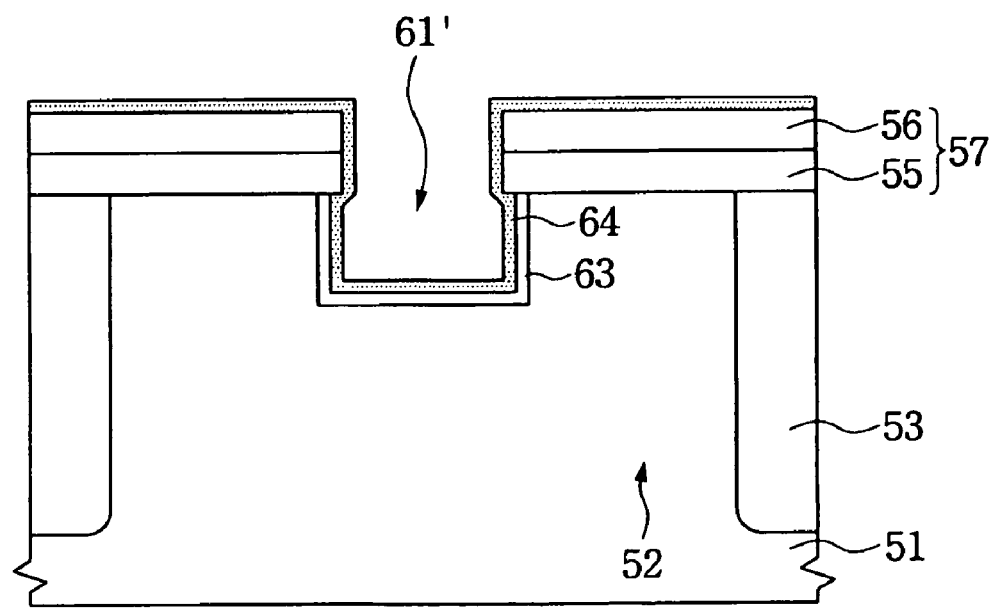

Referring to FIG. 4, a first dielectric layer 63 and a second dielectric layer 64 may be sequentially formed on the substrate 51 having the first gate trench 61'. The first dielectric layer 63 may be formed with a silicon oxide layer by using a radical oxidation method. In example embodiments, the first dielectric layer 63 may be formed to have a uniform thickness on an inner wall of the first gate trench 61'. Alternatively, the first dielectric layer 63 may be formed by using a thermal oxidation method, a chemical vapor deposition method, or an atomic layer deposition method. A thickness of the first dielectric layer 63 may be between about 1 nm and about 10 nm. For example, the thickness of the first dielectric layer 63 may be about 4 nm.

A second dielectric layer 64 may be formed on the first dielectric layer 63. The second dielectric layer 64 may be formed on an entire surface of the substrate 51. As shown, the second dielectric layer 64 may be formed to have a uniform thickness along a surface of the first dielectric layer 63 and the mask pattern 57. The second dielectric layer 64 may be formed with an insulating layer, e.g., a silicon oxide layer, a silicon nitride layer, a silicon oxynitride layer, or a combination thereof. The second dielectric layer 64 may have an etch selectivity to the mask pattern 57. For example, when the mask pattern 57 is formed with a silicon nitride layer, the second dielectric layer 64 may be formed with a silicon oxide layer. A material of the second dielectric layer 64 may be different from a material of the first dielectric layer 63. A thickness of the second dielectric layer 64 may be between about 1 nm and about 10 nm.

Figure 5:
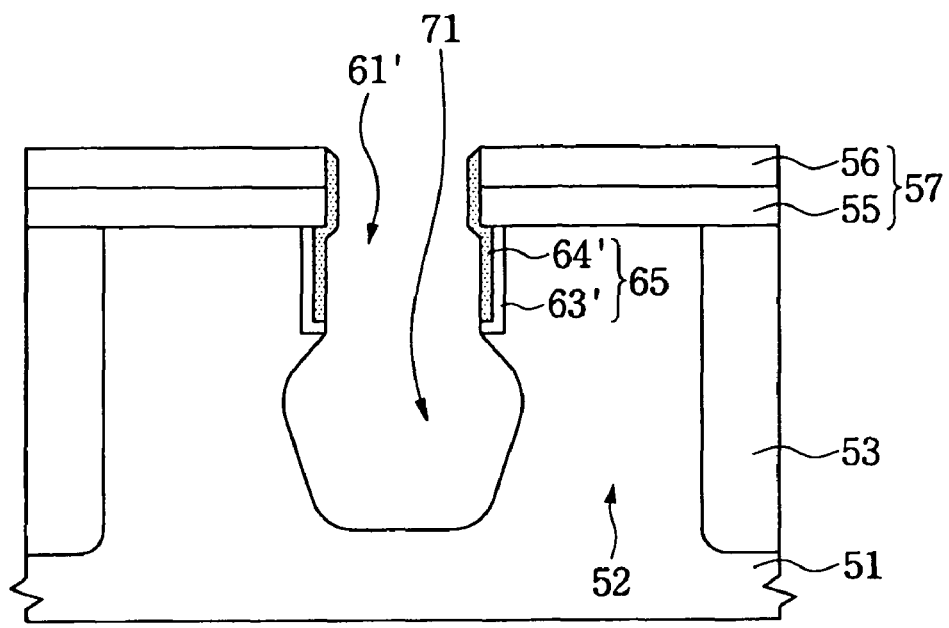

Referring to FIG. 5, the first and second dielectric layers 63 and 64 may be etched to form a second dielectric pattern 64' and a first dielectric pattern 63' on a sidewall of the first gate trench 61'. A dielectric spacer 65 may consist of the first and second dielectric patterns 63' and 64'. Specifically, the process of forming the dielectric spacer may be performed by an anisotropic etch method. In example embodiments, the active region 52 may be exposed on a bottom of the first gate trench 61'. For example, the dielectric spacer 65 may cover a sidewall of the first gate trench 61'.

The exposed active region 52 may be continuously etched using the dielectric spacer 65 and the mask pattern 57 as etch masks to form a second preliminary trench 71 on the bottom of the first gate trench 61'. The second preliminary trench 71 may be formed by using an anisotropic etch process, an isotropic etch process, or a combination thereof. In addition, the second preliminary trench 71 may be formed to be wider than a bottom width of the first gate trench 61'. The second preliminary trench 71 may be connected to the first gate trench 61'. The dielectric spacer 65 may remain on the first gate trench 61'.

Figure 6:
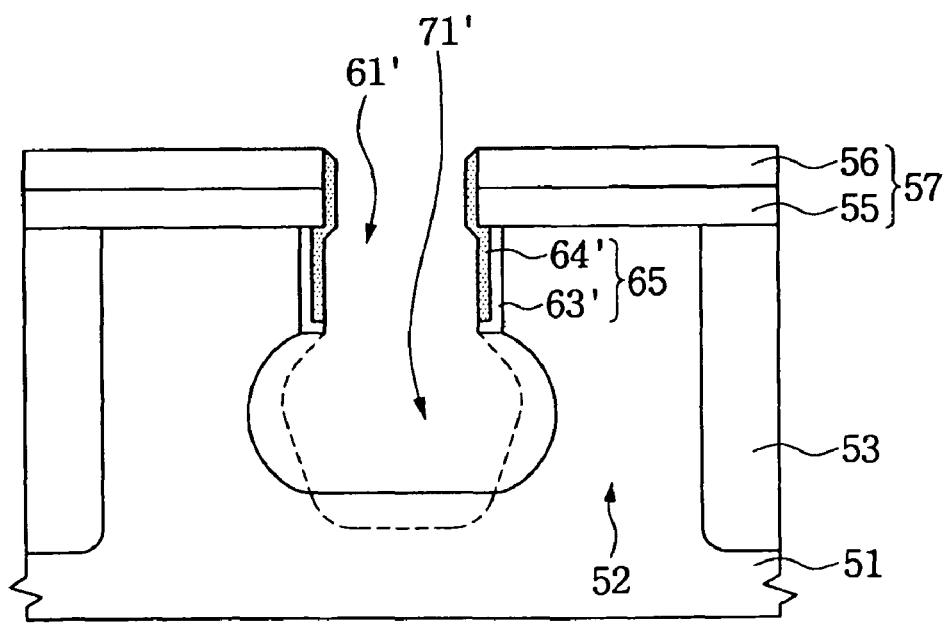

Referring to FIG. 6, in order to expand the second preliminary trench 71, a heat treatment of the substrate 51 may be performed. The heat treatment under an $H_2$ environment may be performed at a temperature of between 700° C. and 800° C. For example, the heat treatment may be performed at 770° C. As a result, the second gate trench 71' may be formed on the bottom of the first gate trench 61'.

By the heat treatment under an $H_2$ environment, the active region 52 exposed on a sidewall of the second preliminary trench 71 may partially collapse. For example, the second gate trench 71' may be formed to be shallower and wider than the second preliminary trench 71. In addition, the second gate trench 71' may be formed to have a spherical shape. The second gate trench 71' may be formed on a higher level than a bottom surface of the device isolation film 53. The second gate trench 71' may be connected to the first gate trench 61'. The active region 52 may be exposed on a sidewall of the second gate trench 71'. In example embodiments, the dielectric spacer 65 may remain on a sidewall of the first gate trench 61'. As described before, the second gate trench 71' may be formed by using one selected method from the group consisting of a heat treatment under an $H_2$ environment, an isotropic etch process and a combination thereof.

Figure 7:
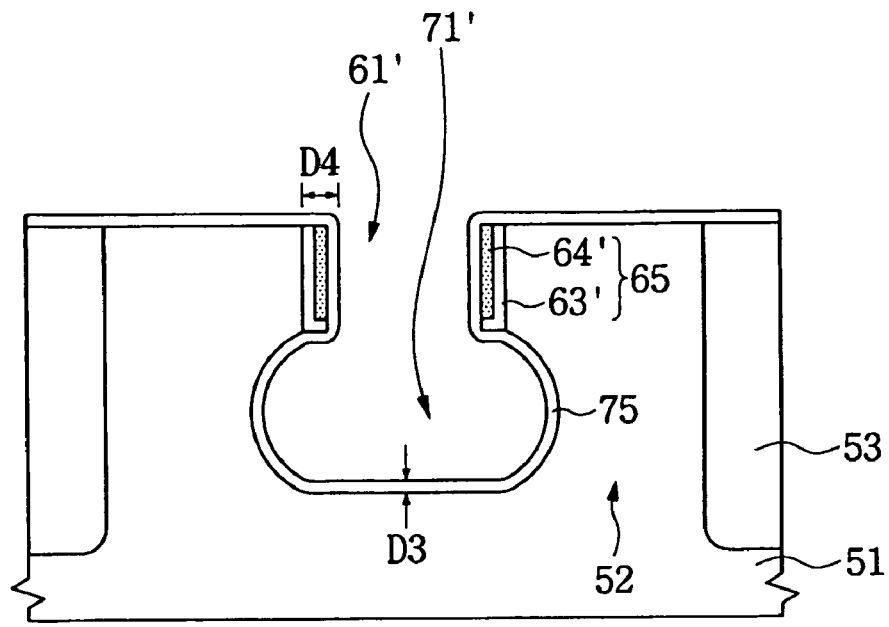

Referring to FIG. 7, the mask pattern 57 may be removed to expose the active region 52. As a result, the active region 52 may be exposed on an inner wall of the second gate trench 71' and the dielectric layer 65 may remain on a sidewall of the first gate trench 61'. Sequentially, a gate dielectric 75 may be formed on the substrate 51 having the dielectric layer 65. The gate dielectric 75 may be formed with a silicon oxide layer, a silicon nitride layer, a silicon oxynitride layer, a high-K dielectric layer, or a combination thereof. The gate dielectric 75 may be formed by a chemical vapor deposition technique or an atomic layer deposition technique.

As shown, the gate dielectric 75 may be formed to cover the inner wall of the second gate trench 71', the sidewall of the first gate trench 61', and the top surface of the active region 52. In example embodiments, the dielectric spacer 65 may remain between the gate dielectric 75 and the active region 52. A portion of the gate dielectric 75 which is formed on the inner wall of the second gate trench 71' may have a first thickness D3. A portion of the dielectric spacer 65 and the gate dielectric 75 which is formed on the first gate trench 61' may have a second thickness D4 as a total thickness of the dielectric spacer 65 and the gate dielectric 75. The second thickness D4 may be thicker than the first thickness D3.

Figure 8:
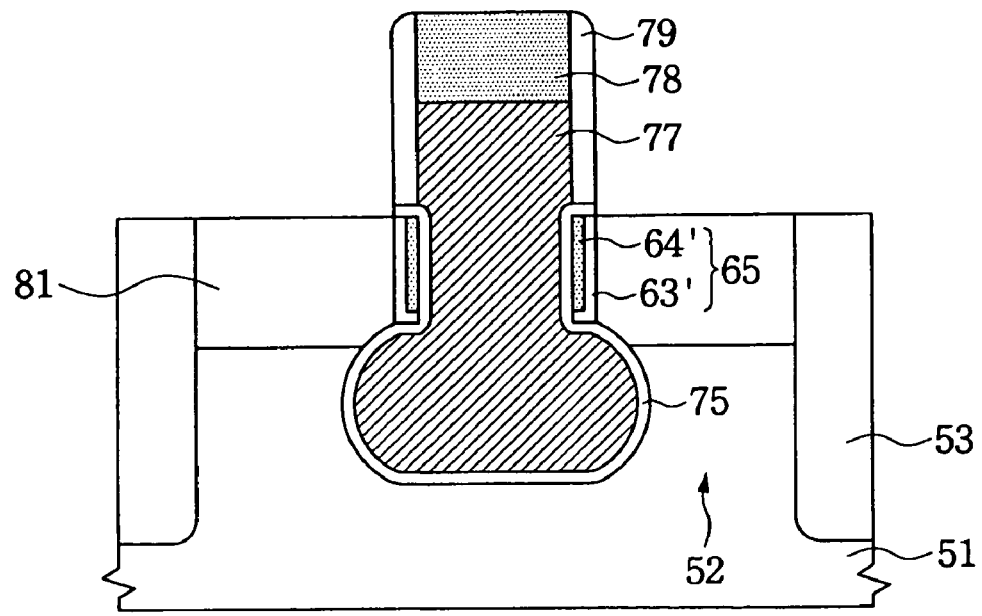

Referring to FIG. 8, a gate electrode 77 and a gate capping pattern 78 may be formed on the gate dielectric 75. A gate spacer 79 may be formed on sidewalls of the gate electrode 77 and the gate capping pattern 78. Source and drain regions 81 may be formed on the active region 52 adjacent to both sidewalls of the gate electrode 77.

The gate electrode 77 may be formed to fill the first and second gate trenches 61' and 71'. The gate electrode 77 may protrude upwardly to be formed on a higher level than the active region 52. The gate electrode 77 may be formed with a conductive layer, e.g., a polysilicon layer, a metal layer, a metal silicide layer, or a combination thereof.

The gate capping pattern 78 may be stacked on the gate electrode 77. The gate capping pattern 78 may be formed with an insulating layer, e.g., a silicon oxide layer, a silicon nitride layer, a silicon oxynitride layer, or a combination thereof. The gate capping pattern 78 may be used as an etch mask while the gate electrode 77 is formed. The gate spacer 79 may be formed with an insulating layer, e.g., a silicon oxide layer, a silicon nitride layer, a silicon oxynitride layer or a combination thereof.

The source and drain regions 81 may be formed by an ion-implanting process using the gate electrode 77 as an implant mask. For example, the source and drain regions 81 may be formed by implanting impurity ions which have a first conductivity type different from a second conductivity type of the active region 52. The source and drain regions 81 may be formed on a higher level than a bottom surface of the gate electrode 77.

As shown in FIG. 7 and FIG. 8, the dielectric spacer 65 may remain between the source and drain regions 81 and the gate electrode 77. As a result, the total thickness of the dielectric spacer 65 and the gate dielectric 75 which are formed on the sidewall of the first gate trench 61' may be thicker than the gate dielectric 75 which is formed on the second gate trench 71'. For example, even though the gate dielectric 75 is thinner on the corner where the top surface of the active region 52 and the sidewall of the first gate trench 61' meet, a necessary thickness between the gate electrode 77 and the active region 52 may be attained by the dielectric spacer 65.

Therefore, a leakage current, e.g., a gate induced drain leakage that may occur on the top corner of the source and drain regions 81 adjacent to the gate electrode 77, may be effectively alleviated. A recess channel transistor may consist of the gate electrode 77, the source and drain regions 81, the active region 52, the gate dielectric 75, and the dielectric spacer 65. According to example embodiments, the recess channel transistor having improved electrical properties may be provided.

Figure 9:
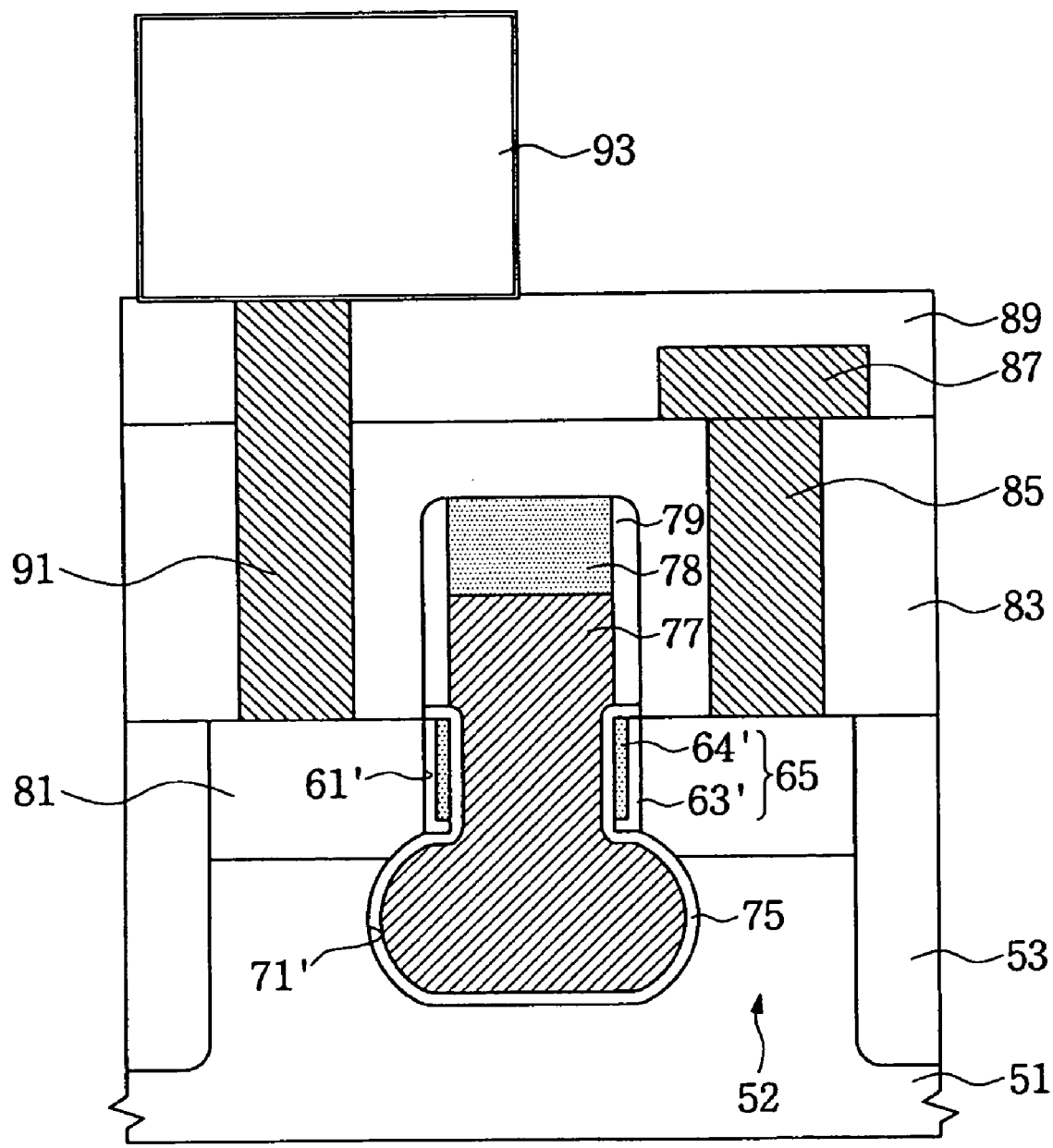

Referring to FIG. 9, a first interlayer dielectric 83 may be formed on the substrate 51 having the gate electrode 77. A bit plug 85, which contacts one of the source and drain regions 81 and is formed through the first interlayer dielectric film 83, may be formed. A bit line 87 contacting the bit plug 85 may be formed on the first interlayer dielectric 83. A second interlayer dielectric 89 may be formed on the first interlayer dielectric 83 to cover the bit line 87.

A buried contact plug 91 may be formed through the second interlayer dielectric 89 and the first interlayer dielectric 83 to contact one of the source and drain regions 81. A storage node 93 may be formed on the second interlayer dielectric 89 to contact the buried contact plug 91. The storage node 93 may be a bottom electrode of a DRAM capacitor.

The first and second interlayer dielectrics 83 and 89 may be formed with a silicon oxide layer, a silicon nitride layer, a silicon oxynitride layer, a low-K dielectric layer, or a combination thereof. The bit plug 85, the bit line 87, the buried contact plug 91, and the storage node 93 may be formed with conductive layers, e.g., a polysilicon layer, a metal layer, a metal silicide layer, or a combination thereof. As described above, according to example embodiments, the leakage current of the recess channel transistor may be effectively reduced. As a result, the DRAM may have distinguished data retention properties.

Figure 10:
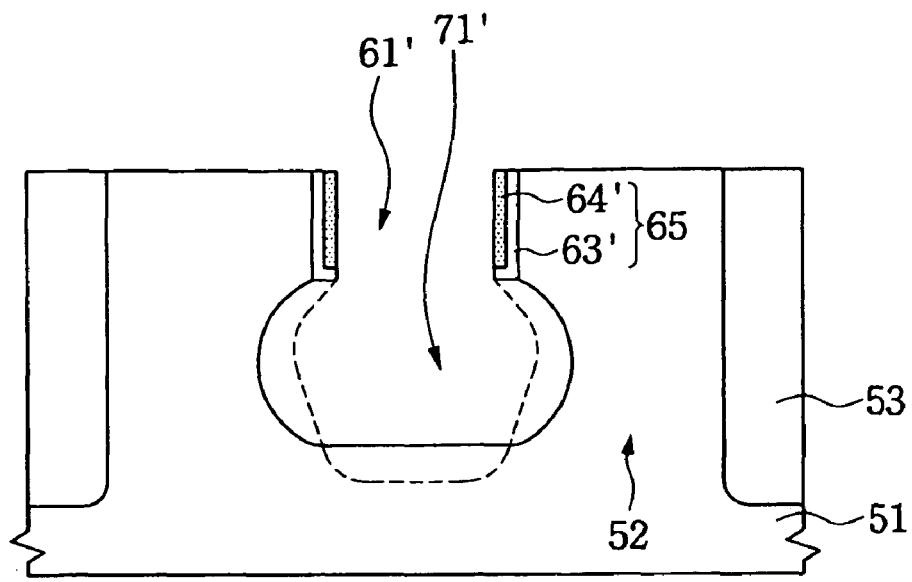

Referring to FIG. 10, a method of fabricating a semiconductor device according to example embodiments will be described. The method according to example embodiments may also include forming the device isolation film 53, the mask pattern 57, the first gate trench 61', the dielectric spacer 65, and the second preliminary trench 71 on the substrate 51 as described before referring to FIGS. 1 to 5. Sequentially, the mask pattern 57 may be removed to expose the active region 52. As a result, the active region 52 on an inner wall of the second preliminary trench 71 may be exposed and the dielectric spacer 65 may remain on a sidewall of the first gate trench 61'.

Sequentially, a heat treatment of the substrate 51 under an $H_2$ environment may be performed to expand the second preliminary trench 71. The heat treatment under an $H_2$ environment may be performed at a temperature of between about 700° C. and about 850° C. For example, the heat treatment may be performed at about 770° C. As a result, a second gate trench 71' may be formed under the first gate trench 61'.

By the heat treatment under an $H_2$ environment, the active region 51 exposed on the sidewall of the second preliminary trench 71 may be partially collapsed. For example, the second gate trench 71' may be formed to be wider than the second preliminary trench 71. The second gate trench 71' may be formed to have a spherical shape. The second gate trench 71' may be formed on a higher level than a top surface of the active region 52. The second gate trench 71' may be connected to the first gate trench 61'. The active region 52 on the inner wall of the second gate trench 71' may be exposed. On the sidewall of the first gate trench 61', the dielectric spacer 65 may remain. Continuously using the same method as described referring to FIGS. 7 to 9, a semiconductor device may be formed.

Figure 11:
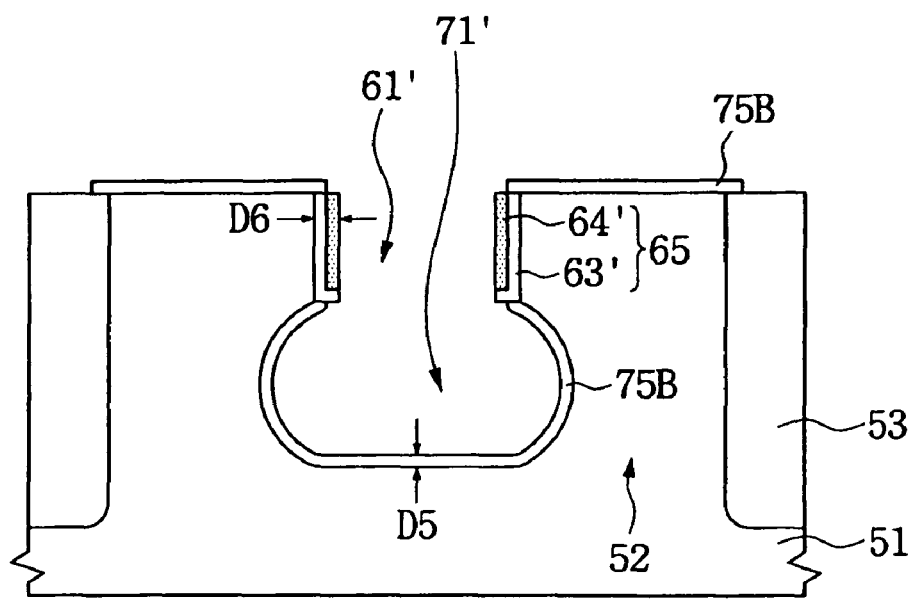

Hereinafter, referring to FIG. 11, a method of fabricating a semiconductor device according to example embodiments will be described. Referring to FIG. 11, the method of fabricating according to example embodiments may include forming the device isolation film 53, the mask pattern 57, the first gate trench 61', the dielectric spacer 65, and the second gate trench 71' on the substrate 51 by using the same method as described referring to FIGS. 1 to 6 and FIG. 10.

Sequentially, a gate dielectric 75B may be formed on an inner wall of the second gate trench 71'. The gate dielectric 75B may be formed with a silicon oxide layer, a silicon nitride layer, a silicon oxynitride layer, a high-K dielectric layer, or a combination thereof. For example, the gate dielectric 75B may be formed with a silicon oxide layer which is formed using a thermal oxidation method. The dielectric spacer 65 may prevent or reduce a silicon oxide layer from growing on the sidewall of the first gate trench 61' by the thermal oxidation method. In example embodiments, the gate dielectric 75B may be formed to cover the inner wall of the second gate trench 71' and a top surface of the active region 52. The dielectric spacer 65 may remain on the sidewall of the first gate trench 61'.

For example, the gate dielectric 75B may be formed to be thinner than the dielectric spacer 65. A portion of the gate dielectric 75B which covers the inner wall of the second gate trench 71' may have a first thickness D5. A portion of the gate dielectric which covers the sidewall of the first gate trench 61' may have a second thickness D6. The second thickness may be thicker than the first thickness. Continuously using the same method as described referring to FIGS. 8 and 9, a semiconductor device may be formed.

Hereinafter, referring to FIG. 9 again, a semiconductor device according to example embodiments will be described. Referring to FIG. 9, a device isolation film 53 may be formed on a substrate 51 to define an active region 52. The substrate 51 may be a silicon wafer, e.g., a bulk wafer and an SOI wafer. A bottom surface of the device isolation film 53 may be disposed on a lower level than a top surface of the active region 52.

A first gate trench 61' and a second gate trench 71' may be formed on the active region 52. The second gate trench 71' may be formed under the first gate trench 61'. The second gate trench 71' may be connected with a lower portion of the first gate trench 61'. The second gate trench 71' may be wider than the first gate trench 61'. The second gate trench 71' may be disposed on a higher level than a bottom surface of the device isolation film 53. The second gate trench 71' may have a spherical shape.

A gate electrode 77 may be disposed to fill the first and second gate trenches 61' and 71'. The gate electrode 77 may protrude upwardly from a top surface of the active region 52. A gate capping pattern 78 may be stacked on the gate electrode 77. A gate dielectric 75 may be formed between the gate electrode 77 and the active region 52. The gate dielectric may be formed with a silicon oxide layer, a silicon nitride layer, a silicon oxynitride layer, a high-K dielectric layer, or a combination thereof.

A sidewall of the first gate trench 61' may be covered with a dielectric spacer 65. In example embodiments, the dielectric spacer 65 may be disposed between the gate dielectric 75 and the active region 52. The dielectric spacer 65 may include a first dielectric pattern 63' and a second dielectric pattern 64'. The first dielectric pattern 63' may contact the active region 52. The second dielectric pattern 64' may be disposed between the first dielectric pattern 63' and the gate dielectric 75.

A material of the first dielectric pattern 63' may be different from a material of the second dielectric pattern 64'. The first dielectric pattern 63' may be a silicon oxide layer formed by a radical oxidation method. Alternatively, the first dielectric pattern 63' may be a silicon oxide layer formed by a thermal oxidation method, a chemical vapor deposition method, or an atomic layer deposition method. The first dielectric pattern 63' may have a thickness of between about 1 nm and about 10 nm. For example, the first dielectric pattern 63' may have a thickness of about 4 nm.

The second dielectric pattern 64' may be formed with an insulating layer, e.g., a silicon oxide layer, a silicon nitride layer, a silicon oxynitride layer, or a combination thereof. For example, when the first dielectric pattern 63' is a silicon oxide layer, the second dielectric pattern 64' may be a nitride layer, e.g., a silicon nitride layer. The second dielectric pattern 64' may have a thickness of between about 1 nm and about 10 nm.

In example embodiments, the dielectric spacer 65 may contact the gate electrode 77. In example embodiments, the dielectric spacer 65 may be disposed between the gate electrode 77 and the active region 52. For example, the gate dielectric 75 may be disposed to cover the second gate trench 71' and the gate dielectric 75 may not exist on the first gate trench 61'. The dielectric spacer 65 may be thicker than the gate dielectric 75.

A gate spacer 79 may be disposed on sidewalls of the gate electrode 77 and the gate capping pattern 78. The gate spacer 79 may be disposed on a higher level than the active region 52. Source and drain regions 81 may be formed on the active region 52 adjacent to the both sides of the gate electrode 77. The gate electrode 77 may be formed with a conductive layer, e.g., a polysilicon layer, a metal layer, a metal silicide layer, or a combination thereof. The gate capping pattern 78 may be formed with an insulating layer, e.g., a silicon oxide layer, a silicon nitride layer, a silicon oxynitride layer, or a combination thereof. The gate spacer 79 may be formed with an insulating layer, e.g., a silicon oxide layer, a silicon nitride layer, a silicon oxynitride layer, or a combination thereof.

A first interlayer dielectric 83 may be formed to cover the substrate 51 having the gate electrode 77 and the source and drain regions 81. A bit plug 85 may be formed through the first interlayer dielectric 83 to contact one of the source and drain regions 81. A bit line 87 may be formed on the first interlayer dielectric 83 to contact the bit plug 85. A second interlayer dielectric 89 may be formed on the first interlayer dielectric 83 to cover the first interlayer dielectric 83.

A buried contact plug 91 may be formed through the second and first interlayer dielectrics 83 and 89 to contact one of the source and drain regions 81. A storage node 93 contacting the buried contact plug 91 may be formed on the second interlayer dielectric 89. The storage node 93 may be a bottom electrode of a DRAM capacitor. The first and second interlayer dielectrics 83 and 89 may be formed with a silicon oxide layer, a silicon nitride layer, a silicon oxynitride layer, a low-K dielectric layer, or a combination thereof. The bit plug 85, the bit line 87, the buried contact plug 91, and the storage node 93 may be formed with a conductive layer, e.g., a polysilicon layer, a metal layer, a metal silicide layer, or a combination thereof.

Although example embodiments have been described in connection with example embodiments illustrated in the accompanying drawings, it is not limited thereto. It will be apparent to those skilled in the art that various substitution, modifications and changes may be thereto without departing from the scope and spirit of the following claims.

What is claimed is:

1. A method of fabricating a recess channel transistor, comprising:
    forming a first gate trench in a substrate;
    forming a dielectric spacer on a sidewall of the first gate trench;
    forming a second gate trench in the substrate under the first gate trench; and
    forming a gate electrode in the first and second gate trenches,
    wherein the dielectric spacer is between the gate electrode and the substrate, and
    wherein forming the first gate trench includes:
        forming a mask pattern on the substrate,
        forming a first preliminary trench to etch the substrate using the mask pattern as an etch mask, and
        expanding the first preliminary trench to isotropically etch the substrate.

2. The method according to claim 1, wherein forming the dielectric spacer comprises:
    forming a first dielectric layer on an inner wall of the first gate trench,
    forming a second dielectric layer on the first dielectric layer,
    etching the first and second dielectric layers until the substrate is exposed on a bottom surface of the first gate trench.

3. The method according to claim 2, wherein the first dielectric layer is formed to a thickness of about 1 nm to about 10 nm by using a radical oxidation method.

4. The method according to claim 2, wherein the second dielectric layer is formed with a material which is different from a material of the first dielectric layer.

5. The method according to claim 4, wherein the second dielectric layer is formed with a nitride layer.

6. The method according to claim 1, further comprising:
    forming a gate dielectric on an inner wall of the first and second gate trenches.

7. The method according to claim 6, wherein the gate dielectric is formed to cover an inner wall of the second gate trench, wherein the dielectric spacer contacts the gate electrode, and wherein the gate dielectric is thinner than the dielectric spacer.

8. The method according to claim 6, wherein the gate dielectric is formed to cover a sidewall of the second gate trench and the dielectric spacer.

9. A method of fabricating a recess channel transistor, comprising:
    forming a first gate trench in a substrate;
    forming a dielectric spacer on a sidewall of the first gate trench;
    forming a second gate trench in the substrate under the first gate trench; and forming a gate electrode in the first and second gate trenches, wherein the dielectric spacer is between the gate electrode and the substrate, and wherein forming the second gate trench includes:

forming a second preliminary trench under the first gate trench by etching the substrate using the dielectric spacer as an etch mask, and expanding the second preliminary trench, wherein the dielectric spacer remains on a sidewall of the first gate trench.

10. The method according to claim 9, wherein expanding the second preliminary trench is performed by one selected from the group consisting of a heat treatment under an $H_2$ environment, an isotropic etch process, and a combination thereof.

11. A semiconductor device comprising:

a substrate having a first gate trench and a second gate trench connected to a lower portion of the first gate trench;

a dielectric spacer covering a sidewall of the first gate trench; and a gate electrode in the first and second gate trenches, wherein the dielectric spacer is between the gate electrode and the substrate, and wherein the dielectric spacer includes:

a first dielectric pattern covering a sidewall of the first gate trench; and a second dielectric pattern on the first dielectric pattern.

12. The semiconductor device according to claim 11, wherein the first dielectric pattern is made of silicon oxide and formed by a radical oxidation method, and wherein a thickness of the first dielectric pattern is about 1 nm to about 10 nm.

13. The semiconductor device according to claim 11, wherein a material of the second dielectric pattern is different from a material of the first dielectric pattern.

14. The semiconductor device according to claim 11, wherein the second gate trench is wider than the first gate trench.

15. The semiconductor device according to claim 11, further comprising:

a gate dielectric between the gate electrode and the substrate.

16. The semiconductor device according to claim 15, wherein the gate dielectric is formed to cover an inner wall of the second gate trench, the dielectric spacer contacts the gate electrode, and the gate dielectric is thinner than the dielectric spacer.

17. The semiconductor device according to claim 15, wherein the gate dielectric is formed to cover an inner wall of the second gate trench and the dielectric spacer.

18. The semiconductor device according to claim 11, wherein the gate electrode protrudes upwardly from the substrate.

19. The semiconductor device according to claim 11, further comprising:

an interlayer dielectric on the substrate;

a bit line in the interlayer dielectric;

a bit plug between the bit line and the substrate;

a storage node on the interlayer dielectric; and a buried contact plug between the storage node and the substrate.

* * * * *